(12) United States Patent
Hashimoto et al.

(10) Patent No.: US 6,870,737 B2
(45) Date of Patent: Mar. 22, 2005

(54) COOLING SYSTEM FOR POWER CONVERSION DEVICE

(75) Inventors: Takashi Hashimoto, Saitama-ken (JP); Masaki Miyairi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 463 days.

(21) Appl. No.: 10/086,567

(22) Filed: Mar. 4, 2002

(65) Prior Publication Data

US 2002/0121811 A1 Sep. 5, 2002

(30) Foreign Application Priority Data

Mar. 5, 2001 (JP) ........................................ 2001-059492

(51) Int. Cl.$^7$ ................................................. H05K 7/20
(52) U.S. Cl. ........................................................ 361/709
(58) Field of Search ............................ 307/149, 11, 22, 307/43; 361/704, 709, 714; 363/13

(56) References Cited

U.S. PATENT DOCUMENTS

| | | | | |
|---|---|---|---|---|
| 4,675,783 A | * | 6/1987 | Murase et al. | ............... 361/699 |
| 6,038,156 A | * | 3/2000 | Inam et al. | .................. 363/133 |
| 6,721,181 B1 | * | 4/2004 | Pfeifer et al. | ................ 361/704 |

\* cited by examiner

*Primary Examiner*—Edward H. Tso
(74) *Attorney, Agent, or Firm*—Finnegan, Henderson, Farabow, Garrett & Dunner, L.L.P.

(57) ABSTRACT

According to the present invention, a power conversion device comprises a plurality of sets of power conversion circuits that convert AC to DC or DC to AC by the switching action of a plurality of semiconductor elements, the semiconductor elements that constitute the plurality of sets of power conversion circuits are mounted on a common cooling unit having a heat sink section and heat discharging section. By smoothing out the apportionment of heat loss applied to the plurality of coolers constituting this cooling unit, a cooling construction of the minimum necessary size can be achieved and miniaturization and weight reduction can be realized.

12 Claims, 19 Drawing Sheets

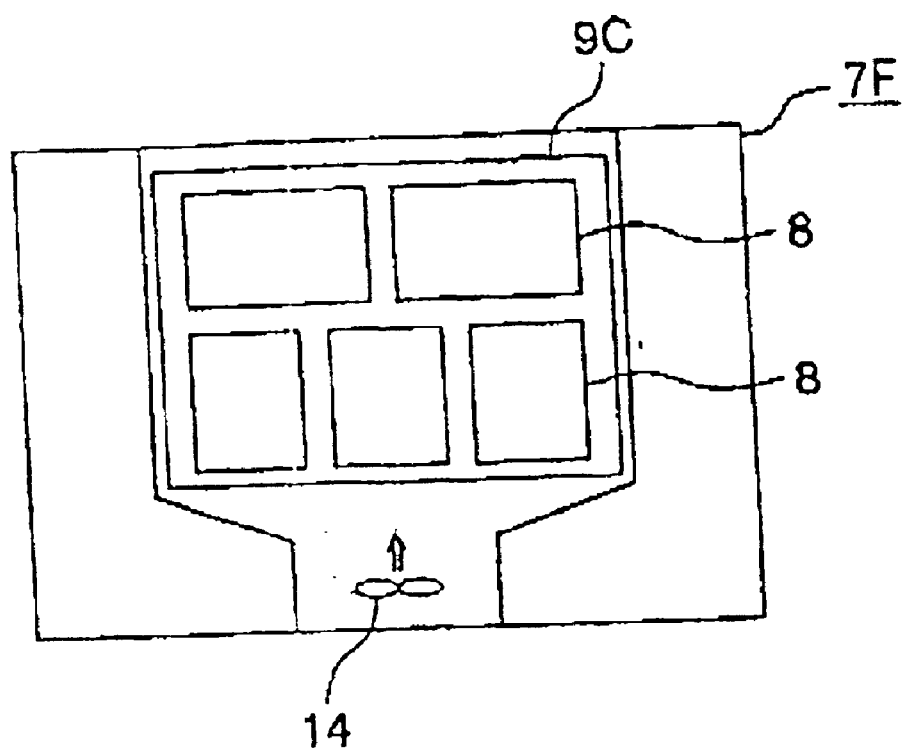
FIG. 1 2 A
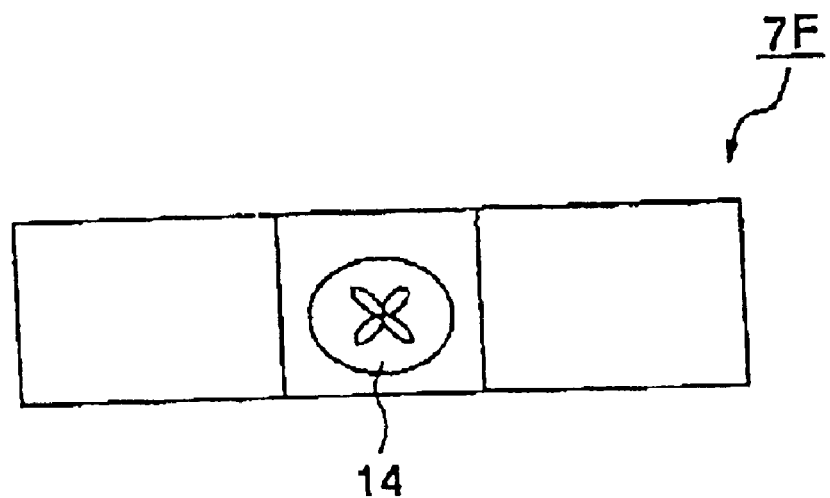
FIG. 1 2 B

COOLING SYSTEM FOR POWER CONVERSION DEVICE

CROSS-REFERENCE TO RELATED APPLICATION

This application claims benefit of priority to Japanese application number JP 2001-59492 filed Mar. 5, 2001, the entire content of which is incorporated by reference herein.

BACKGROUND OF THE INVENTION

1. Field of the Invention

The present invention relates to a power conversion device incorporating a plurality of power conversion circuits.

2. Description of the Related Art

Power conversion circuits constituted by semiconductor elements are of various types and comprise inverter circuits that convert DC to AC and converter circuits that convert AC to DC. Also, inverter circuits comprise variable voltage variable frequency inverter circuits (hereinbelow termed VVVF inverters) in which the voltage and frequency of the AC output are controlled in variable fashion and constant voltage constant frequency inverter circuits (hereinbelow termed CVCF inverters) in which the voltage and frequency of the AC output are controlled to be fixed; a power conversion system is constituted of these.

Taking a railway vehicle system as an example, a power conversion device incorporating for each control unit a plurality of sets of VVVF inverter circuits that control the induction motors used for vehicle drive is mounted in a vehicle. For example, power conversion devices are commonly employed that incorporate a number of sets of VVVF inverter circuits corresponding to one vehicle, specifically, four sets that respectively individually control a single induction motor. Such a power conversion device is a system having excellent redundancy in that, in the event of malfunction, operation can be continued by isolating the malfunctioning VVVF inverter circuit. CVCF inverter circuits are employed in auxiliary power source systems; recently, a system has been proposed in which redundancy of a railway system is improved by incorporating a plurality of sets of VVVF inverter circuits and a CVCF inverter circuit in a single power conversion circuit; in the event of malfunction of the CVCF inverter circuit one of the sets of VVVF inverter circuits is changed over to the CVCF inverter circuit.

Typically in AC electric trains a system is employed in which an induction motor (inductive electric motor) is driven by controlling output voltage and output frequency using a combination of a converter circuit that converts AC to DC and an inverter circuit that converts DC to AC. Conventionally, these various types of power conversion systems were provided in a vehicle as separate devices but recently there has been a tendency to incorporate the various types of conversion circuit in a single power conversion device with a view to saving installation space and achieving circuit integration in order to reduce the number of wirings connecting the devices. In a power conversion device wherein a plurality of sets of power conversion circuits are accommodated in a single device, these are installed in separate regions defined within the device for, for example, each of the electrical functions of converter conversion circuit section, inverter conversion circuit section, control panel section (control unit) and control power source section, these being often respectively constituted in unit form.

In a conversion circuit section employing semiconductor elements, a cooler is required to discharge the heat generated by the semiconductor elements (hereinbelow referred to as heat loss) to outside the device, to ensure that the semiconductor elements are used with their temperature below the permitted value. The basic construction of the cooler comprises a heat sink section where the semiconductor elements are mounted and a heat discharging section where the heat is dispersed to the atmosphere; the heat sink section (heat receiving section) is placed in a sealed chamber portion of the power conversion device and the heat discharging section is placed in an open chamber section through which the atmosphere passes. The open chamber section where the heat discharging section is placed may project somewhat beyond the body of the device to facilitate dispersal of heat to the atmosphere, or may be constituted as a cooling air channel through which a current of cooling air is forcibly made to flow by an electric fan, or may be arranged in a location exposed to the running air current flowing relatively over the external surface of the device when the vehicle is moving, in the case of a device arranged below the floor of the rail vehicle.

A prior art power conversion device incorporating a plurality of sets of such conversion circuits is described below. FIG. 1 is a circuit diagram of a power conversion device driver of a rail vehicle, being a circuit diagram of a power conversion device incorporating four sets of VVVF inverter circuits that individually control the electric motors for a single vehicle i.e. four induction motors. In this Figure, the positive input terminals of VVVF inverter circuits 4 are connected through circuit breakers 2 and filter reactors 3 with pantograph 1, and the negative input terminals thereof are grounded through the vehicle wheels. Also, respective filter capacitors 5 are connected between the positive and negative input terminals of VVVF inverter circuits 4 and, furthermore, induction motors 6 are connected with the output terminals. Four sets of circuits are connected in parallel in this way, the four sets of VVVF inverter circuits 4 individually controlling the four induction motors in a single vehicle. Of the electrical components shown in this circuit diagram, the four sets of VVVF inverter circuits 4 and filter capacitors are accommodated within a single box to constitute power conversion device 7A, the remaining electrical components being respectively individually separate or accommodated in another box of the device, these being electrically connected by vehicle body wiring to constitute a rail vehicle drive system.

FIG. 2A is a perspective view illustrating the condition in which a power conversion device 7A as described above is mounted below the floor of a rail vehicle; FIG. 2B is a side view seen from the direction of forward movement of the vehicle; FIG. 3A is a plan view of power conversion device 7A seen from the direction in which this is mounted on the bottom face of the vehicle; and FIG. 3B is a bottom face view thereof. In these Figures, power conversion device 7A comprises four coolers that cool semiconductor elements 8 (referring generally to elements constituted by for example connecting snubber diodes in parallel with IGBTs). Semiconductor elements 8 corresponding to one set of VVVF inverter circuits are accommodated together in a single cooler 9 and filter capacitors 5 are accommodated in a single box.

It should be noted that, although a single set of VVVF inverter circuits consists of inverter circuits of the three phases U, V and W, in some cases, a single cooler 9 may be provided in common for each of the phases of four sets of VVVF inverter circuits; thus three of these may be arranged next to each other. With this arrangement, if the semiconductor elements 8 corresponding to each phase constituting the VVVF inverter circuits of each set are thus arranged in integrated fashion, the electrical connection and arrangement of the peripheral components thereof is facilitated, and the power conversion device 7A is functionally divided, making it possible to achieve a unitary construction for each function, so coolers 9 are also of a form in which they are combined in this way for the conversion circuits of each set.

In the cooler 9 shown in FIG. 1 to FIG. 3, there are fitted a cooling units comprising a heat sink section where the semiconductor elements 8 are mounted and a heat discharging section that performs heat dispersal to the atmosphere; the heat sink section is placed in a sealed chamber portion of power conversion device 7A and the heat discharging section is placed in an open chamber section through which the atmosphere passes. The construction is such that the open chamber portion where the heat radiating section is placed protrudes somewhat from the body of the box so as to facilitate dispersal of heat to the atmosphere and furthermore so that it is exposed to the running air current flowing relatively over the external surface of the device during running of the vehicle.

Although heat loss is generated from the semiconductor elements 8 during operation of power conversion device 7A, this is transmitted by thermal conduction to the heat sink sections of the cooling units mounted within coolers 9, so that the semiconductor elements 8 are cooled by heat dispersal to the atmosphere from the heat discharging sections of the cooling units, thereby making it possible for these to be employed at the permitted temperature or below.

Now, during operation in which all of the four sets of VVVF inverters that constitute power conversion device 7A are normal, the four sets of VVVF inverters are individually controlled but, since the heat loss generated from these respective sets is practically the same, practically identical amounts of heat lose are dispersed by the respective coolers 9. However, it is a characteristic of this power conversion device 7A that in the event of malfunction of power conversion device 7A it is arranged for the malfunctioning set of VVVF inverter circuits to be isolated by circuit breaker 2, operation being continued with the remaining sets of VVVF inverter circuits, thus conferring redundancy on the system.

When operation with the remaining three sets of VVVF inverter circuits is continued owing to malfunction of one set of VVVF inverter circuits, it is necessary that a larger current should flow in the semiconductor elements 8 constituting the VVVF inverter circuits that are continuing in operation than would be flowing if all four sets of VVVF inverter circuits were normal. Consequently, the amount of heat loss generated from the semiconductor elements 8 also becomes more than during normal operation, so that a higher performance in respect of heat dispersal capability by coolers 9 is demanded than in the normal case. A heat discharging capability of the respective coolers 9 must therefore be ensured such as to enable not just the heat loss that occurs when all of the four sets of VVVF inverter circuits are operating normally but also the heat loss in the event of malfunction, which is increased compared with normal operation, to be dealt with. In other words, while, in the case of normal operation, there is a margin in respect of the cooling capacity of the respective coolers 9, in the event of malfunction, the cooler 9 where the semiconductor elements 8 of the VVVF inverter circuits that have been isolated due to malfunction are mounted does not perform any discharged heat processing at all, so the coolers 9 where the semiconductor elements 8 of the remaining VVVF inverter circuits, that are continuing in operation, are mounted must perform this heat discharge processing on their own.

As a result, coolers 9 must individually be made of large size and this is a factor impeding miniaturization and weight reduction of the power conversion device 7A.

A further conventional power conversion device incorporating a plurality of sets of power conversion circuits is described below. FIG. 4 is a Circuit diagram of a power conversion device 7B wherein two sets of VVVF inverter circuits for driving a vehicle and a single set of CVCF inverter circuits 17 for serving as a vehicle power source are constituted as a single system; in the Figure, elements that are identical with FIG. 1 are given the same reference symbols and further description thereof is omitted. This is so constructed that it is made capable of performing operation wherein one of the two sets of VVVF inverter circuits is changed over from VVVF inverter circuits to CVCF inverter circuits in the event of malfunction of the CVCF inverter circuits; in this way, redundancy of the vehicle system is improved by guaranteeing the vehicle power source.

FIG. 5A is a perspective view (a bird's-eye view) illustrating the condition in which the power conversion device shown in FIG. 4 is mounted below the floor of a rail vehicle. FIG. 5B is a side view seen from the direction of forward movement of the vehicle, FIG. 6A is a plan view of power conversion device 7 seen from the direction of mounting on the bottom face of the vehicle and FIG. 6B is a bottom face view thereof. Two coolers 9 are provided for the VVVF inverter circuits and a single cooler 9 for the CVCF inverter circuits, in the same way as in the case of the conventional device shown in FIG. 1 to FIG. 3, these being respectively of unitary construction.

Although a detailed description of the changeover operation will not be given here, in the event of malfunction of the CVCF inverter circuits, cooler 9 where the semiconductor elements 8 of the CVCF inverter circuits are mounted, of course, does not perform processing of discharged heat, so the two coolers that previously performed discharged heat processing for the VVVF inverter circuits must now act as coolers for VVVF inverter circuits and CVCF inverter circuits. For the coolers 9 where the set of semiconductor elements 8 are mounted that continue in operation as VVVF inverter circuits, a higher heat discharging capability is demanded than in the case of normal operation, just as in the case of the prior art device shown in FIG. 1 to FIG. 3; thus, an external shape of coolers 9 matching this heat discharging capability is needed. Also, although it is demanded that the VVVF inverter circuits and CVCF inverter circuits should be constructed in common, depending on the vehicle system to which they are applied, the heat loss generated from the semiconductor elements 8 by VVVF inverter circuits and CVCF inverter circuits is not necessarily the same; nevertheless, since coolers 9 of the same shape were employed, it could hardly be said that the respective coolers 9 all bore the burden of heat discharge processing equally, even during normal operation; this fact also was a factor impeding miniaturization and weight reduction of power conversion device 7B.

Yet a further conventional power conversion device incorporating a plurality of sets of conversion circuits is described below with reference to FIG. 7 to FIG. 9. FIG. 7 is a circuit diagram of this power conversion device 7C. This comprises essentially double converter circuits 18 that input AC and convert this AC to DC and inverter circuits 19 that take the DC converted by these converter circuits 18 and convert it to AC controlled with variable voltage and variable frequency; a system that drives four induction motors 6 of a rail vehicle is thereby constituted. FIG. 8A is a plan view seen from the side where this power conversion device 7C is mounted on the vehicle bottom, FIG. 8B is a side view seen from the direction of forwards movement of the vehicle and FIG. 9 is a cross-sectional view seen in the direction of the arrows A—A of FIG. 8B. This power conversion device 7C comprises two cooling units 9a, 9b; of these, cooling unit 9a has mounted thereon semiconductor elements 8 constituting converter circuits while cooling unit 9b has mounted thereon semiconductor elements 8 constituting inverter circuits, respectively; heat discharge is arranged to be performed forcibly by means of a current of air supplied by an electrically driven fan 14.

The heat loss generated from the respective conversion circuits does not increase and decrease with the same timing but rather increases and decreases with different timings. At comparatively low speed of the rail vehicle i.e. during acceleration/deceleration the heat loss generated from the inverter circuits is larger; during comparatively high-speed operation, the heat loss generated from the converter circuits is larger. Consequently, when the heat dispersal from the side of cooling unit 9a is large, the heat dispersal from the side of cooling unit 9b is comparatively small and when the heat dispersal from the side of cooling unit 9b is large the heat dispersal from the side of cooling unit 9a is comparatively small. In addition, since, with this device, the heat discharging sides of cooling units 9a, 9b are forcibly cooled by delivery of an air current, their thermal time constants are small, so the sizes of the respective cooling units 9a, 9b are determined by the maximum heat loss. That is, since the temperature of the coolers tracks increase/decrease of heat loss in a short time, when the heat loss varies with time, it is necessary to make it possible to achieve cooling with the maximum heat loss in a short time.

Even in the case of the power conversion devices shown in FIG. 7 to FIG. 9, just as in the case of the power conversion devices shown in FIG. 1 to FIG. 3 or FIG. 4 to FIG. 6, due to the adoption of a unitary construction for each of the plurality of sets of conversion circuits, an unbalanced condition of the thermal load applied to the respective coolers was frequently produced; as a result, the coolers were of large size and miniaturization/weight reduction of the device was impeded.

SUMMARY OF THE INVENTION

Accordingly, one object of the present invention is to provide a novel power conversion device aimed at solving the aforesaid problems, wherein the cooling construction can be made of the minimum necessary size and miniaturization and weight reduction achieved, by smoothing out the apportionment of heat loss applied to the plurality of coolers.

In order to achieve the above object, the present invention is constituted as follows. Specifically, in a power conversion device incorporating a plurality of sets of power conversion circuits that convert AC to DC or DC to AC by the switching action of a plurality of semiconductor elements, the semiconductor elements constituting the plurality of sets of conversion circuits are mounted on a common cooling unit having a heat sink section and heat discharging section.

With the present invention constituted in this way, the apportionment of heat loss applied to the plurality of coolers is smoothed out, thereby making it possible to provide a power conversion device in which the cooling structure can be made of the minimum necessary size and whereby miniaturization and weight reduction can be realized.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 12 is a plan view seen from the direction in which a third embodiment of a power conversion device according to the present invention is mounted on the bottom face of a vehicle and a bottom face view thereof;

DETAILED DESCRIPTION OF THE PREFERRED EMBODIMENTS

Figure 1:
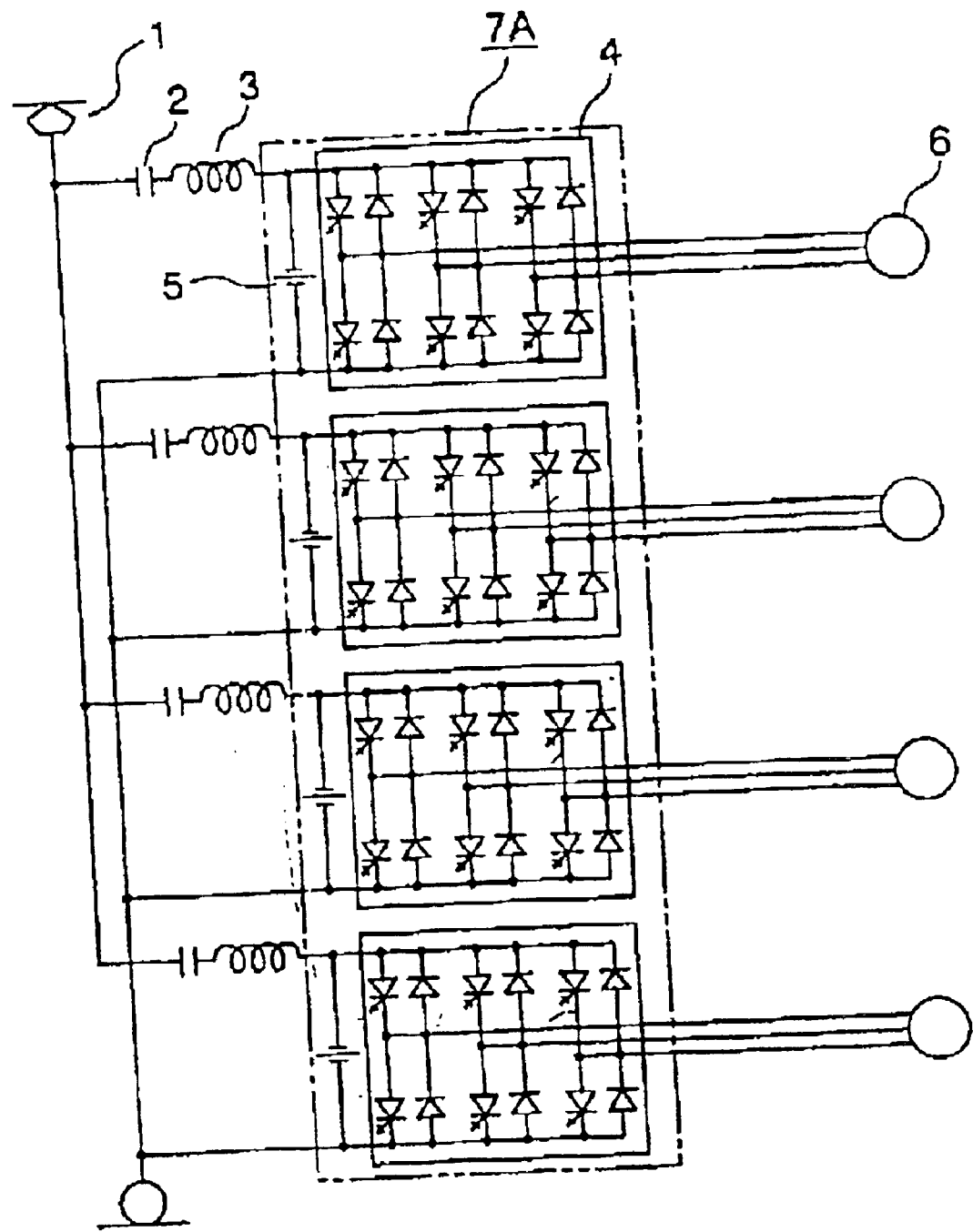
FIG. 1 is a circuit diagram illustrating the layout of a prior art power conversion device for rail vehicle drive having four sets of VVVF inverter circuits.
Figure 2A:
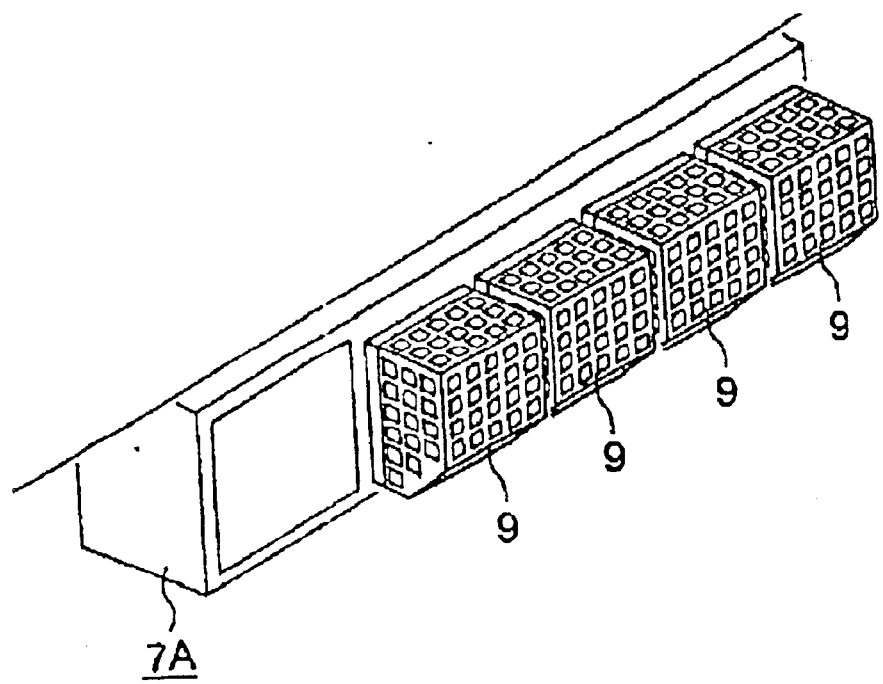
FIG. 2 is a perspective view illustrating the condition in which the power conversion device shown in FIG. 1 is mounted under the floor of a rail vehicle and a side view seen from the direction of forward movement of the rail vehicle.
Figure 2B:
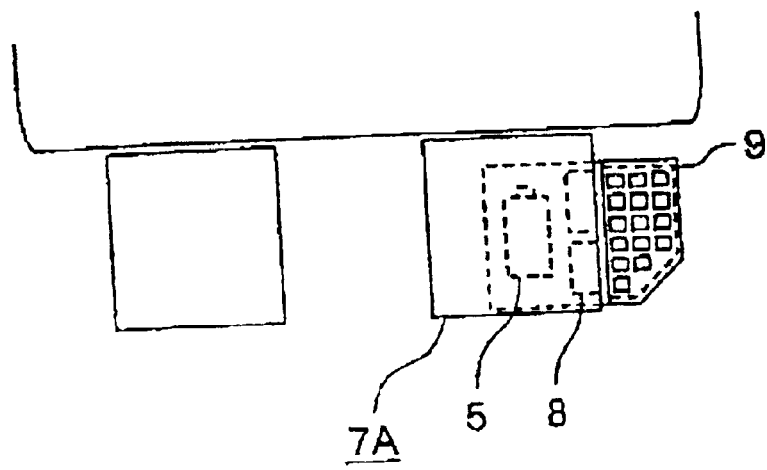
Figure 3:
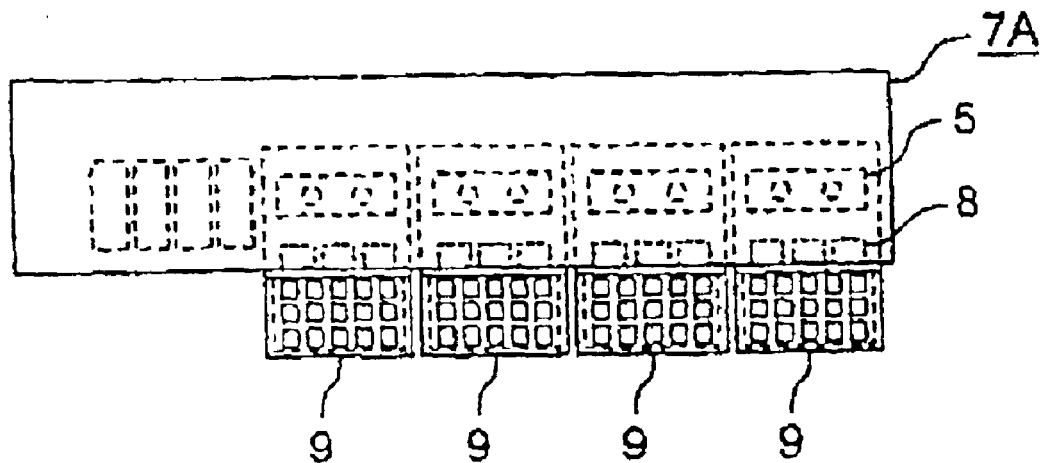
FIG. 3 is a plan view and bottom face view seen from the direction in which the power conversion device shown in FIG. 1 is mounted on the bottom face of the vehicle.
Figure 3:
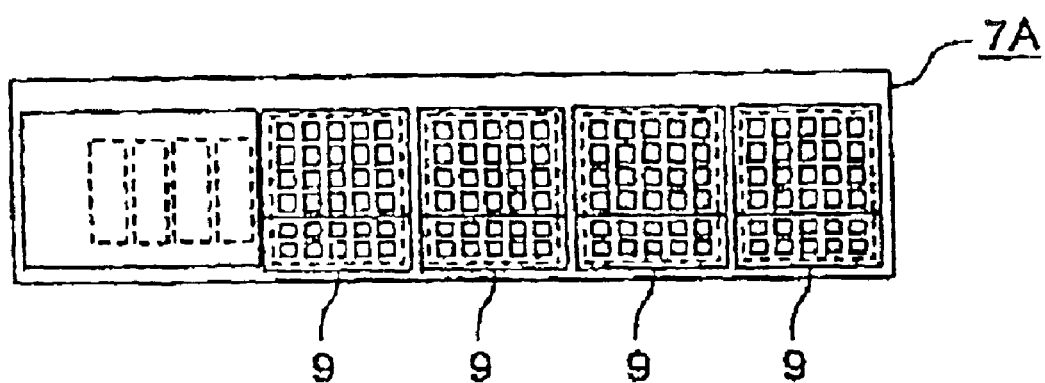

Referring now to the drawings, wherein like reference numerals designate identical or corresponding parts throughout the several views, and more particularly to FIG. 10 thereof, one embodiment of the present invention will be described.

Figure 10A:
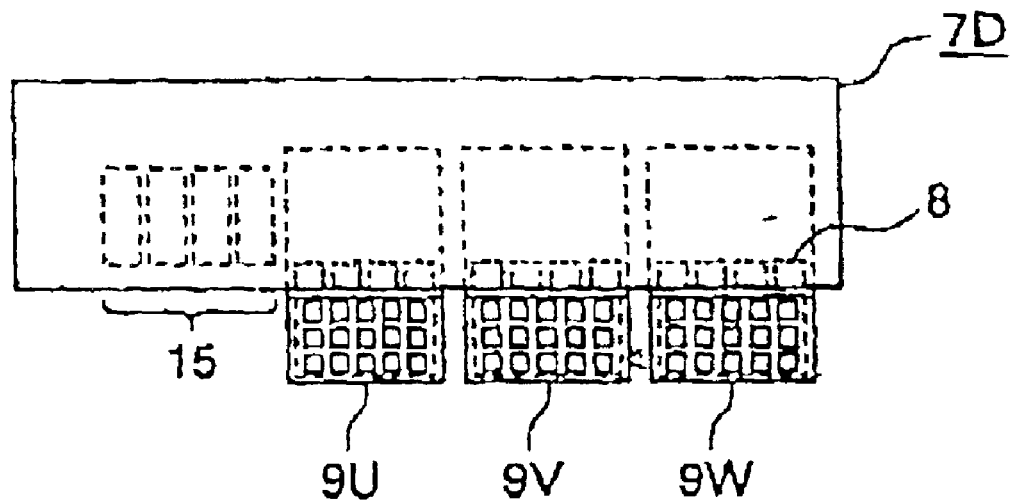
FIG. 10 is a plan view seen from the direction in which a first embodiment of a power conversion device according to the present invention is mounted on the bottom face of a vehicle and a bottom face view thereof.
Figure 10B:
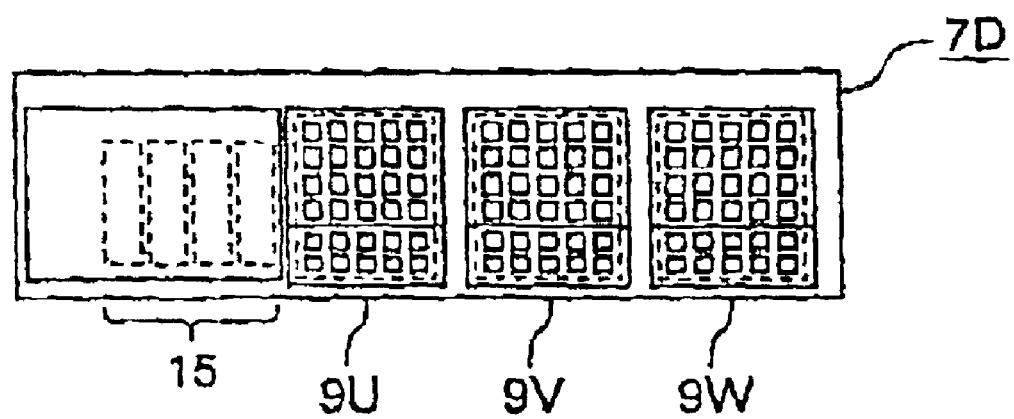

FIG. 10 illustrates the layout of a first embodiment of a power conversion device according to the present invention; therein, FIG. 10A is a plan view seen from the direction of mounting on the bottom face of the vehicle and FIG. 10B is a bottom face view thereof. The power conversion device 7D illustrated herein is applied to the four sets of VVVF inverter circuits shown in the circuit diagram of FIG. 1 as a prior art device; in this construction, the structural components of each set are incorporated with and allocated to the three coolers 9U, 9V, and 9W for each phase. Specifically, of the four sets of VVVF inverter circuits, the semiconductor elements 8 of the U phase of each set are incorporated with cooler 9U, the semiconductor elements 8 of the V phase of each set are incorporated with cooler 9V, and the semiconductor elements 8 of the W phase of each set are incorporated with cooler 9W. Power conversion device 7D further incorporates four control sections 15 arranged so as to control respectively individually the four sets of VVVF inverter circuits.

Thus, when the four sets of VVVF inverter circuits are operating normally, the heat loss generated from semiconductor elements 8 is discharged to the atmosphere from the coolers 9U, 9V and 9W and all of the semiconductor elements 8 are cooled to the permitted temperature or below, In this situation, the respective coolers 9U, 9V and 9W are subjected to practically identical heat loss loads, so the semiconductor elements 8 are cooled to the permissible temperature (allowable temperature) or below.

On the other hand, if one set of the four sets of VVVF inverter circuits malfunctions, causing operation to be performed with this one set isolated from the system, a larger current than normal flows in the remaining VVVF inverter circuits that are continuing in operation, so it is necessary to prevent a drop in system performance. In this case, the heat loss from the semiconductor elements 8 constituting the VVVF inverter circuits is increased. However, the heat lose load is practically evenly distributed over all of the coolers 9U, 9V and 9W and coolers 9U, 9V and 9W have the capability to cool the heat loss produced by the original four sets, so, even though the heat loss of the three sets is increased more than normal, satisfactory cooling is performed.

Thus, apart from ordinary operation in which all of the sets of VVVF inverter circuits are normal, even if one set of VVVF inverter circuits has been isolated due to malfunction so that operation is being performed with the remaining sets of VVVF Inverter circuits, all of the plurality of coolers exhibit an efficient cooling performance. Since, according to the present invention, the cooling system performs its cooling action efficiently, whereas in general the size of the coolers is responsible for a large proportion of the external shape of the power conversion device, miniaturization of the coolers as a whole becomes possible and reduction in size and weight of the entire power conversion device can be achieved.

Figure 4:
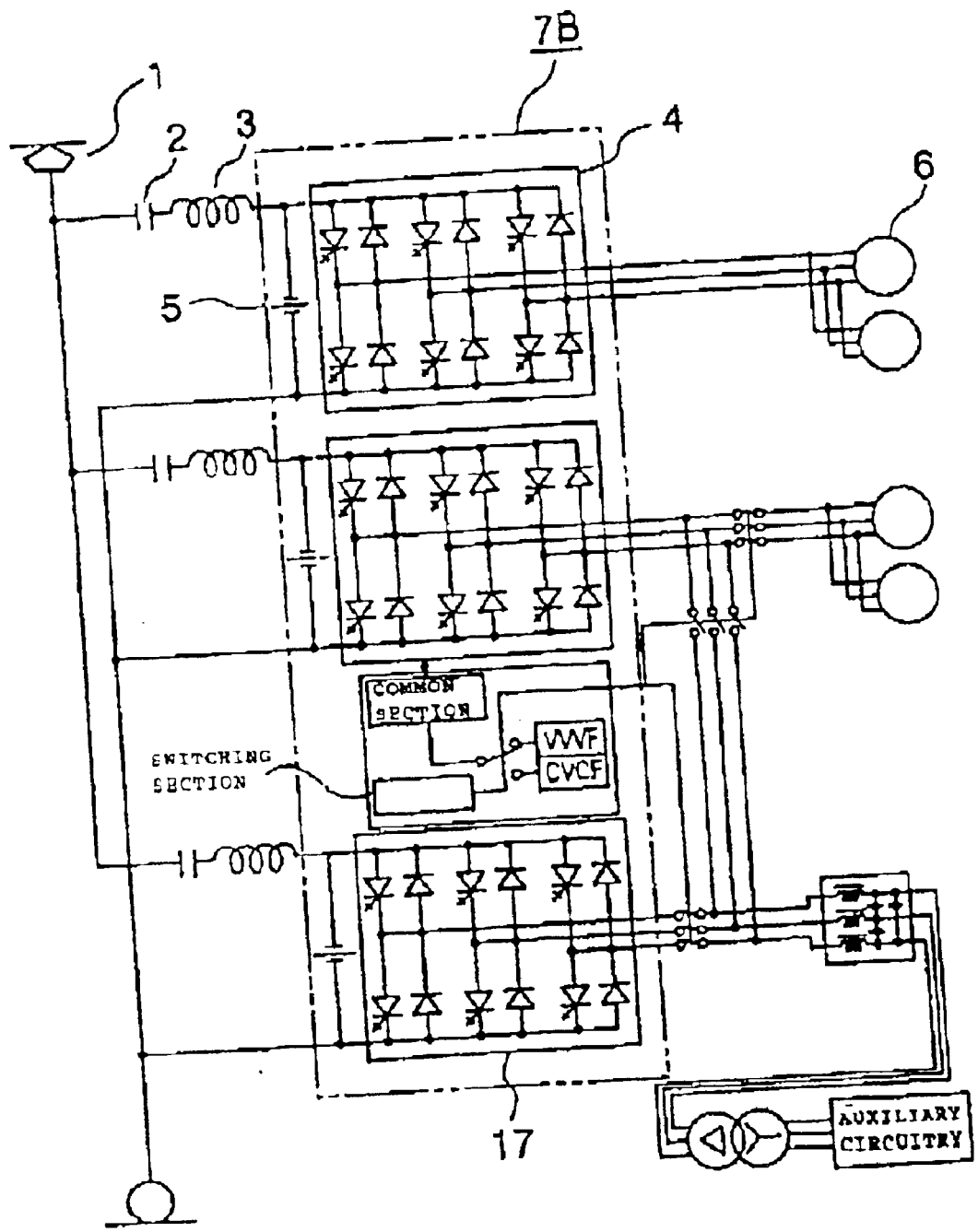
FIG. 4 is a circuit diagram illustrating the layout of a power conversion device for rail vehicle drive including two sets of VVVF inverter circuits and one set of CVCF inverter circuits, constituting another prior art power conversion device.
Figure 5:
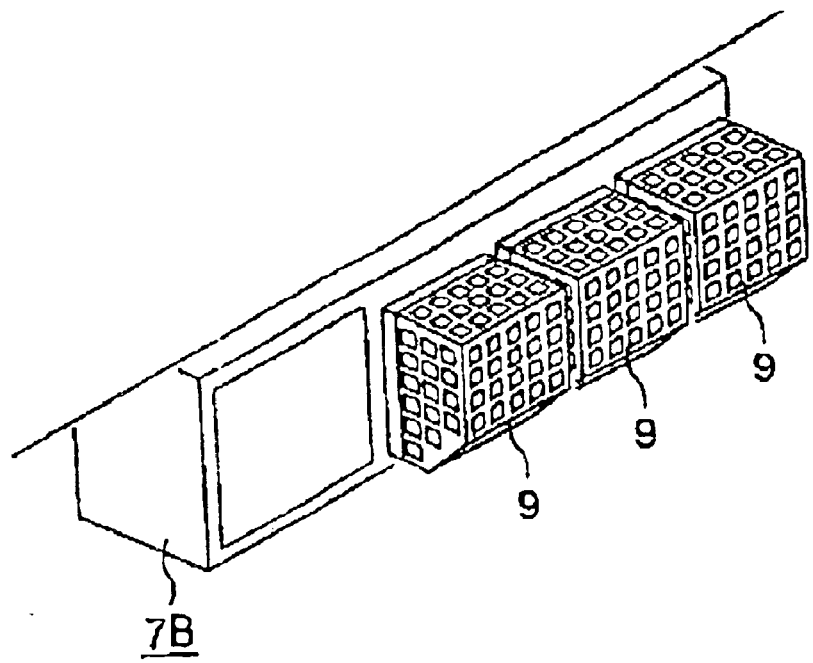
FIG. 5 is a perspective view illustrating the condition in which the power conversion device shown in FIG. 4 is mounted below the floor of a rail vehicle and a side view seen from the direction of forward movement of the vehicle.
Figure 5:
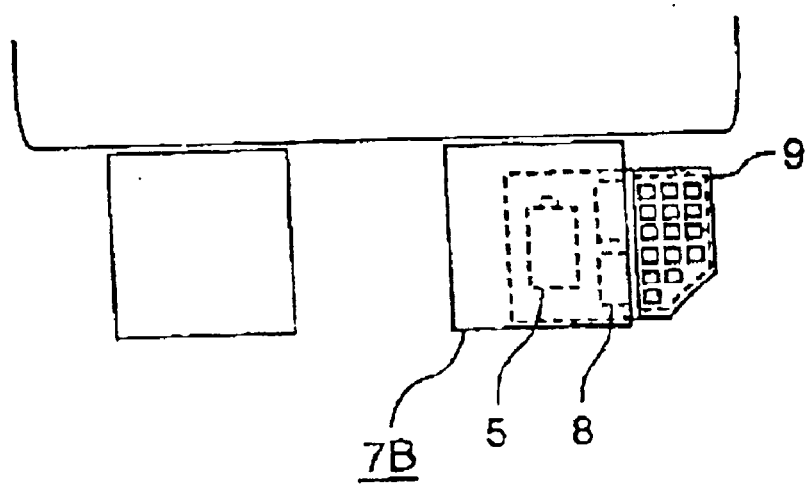
Figure 6:
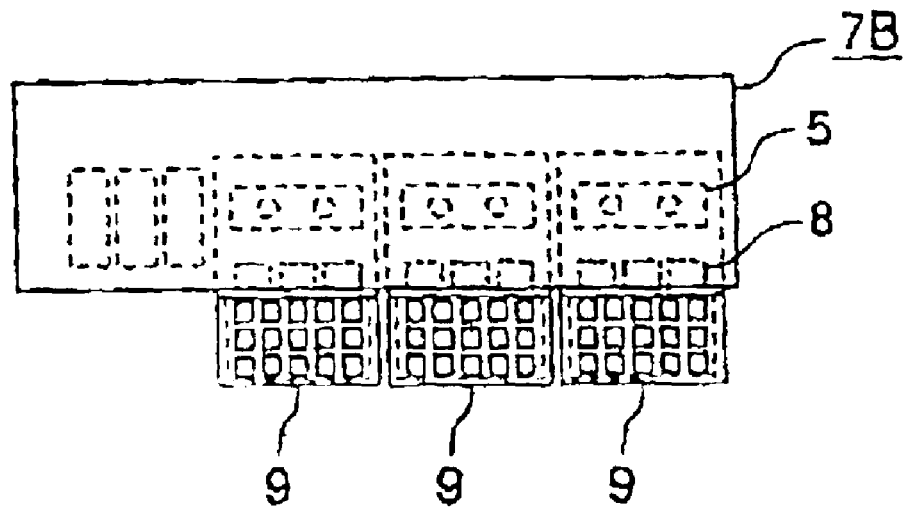
FIG. 6 is a plan view and bottom face view seen from the direction in which the power conversion device shown in FIG. 4 is mounted on the bottom face of the vehicle.
Figure 6:
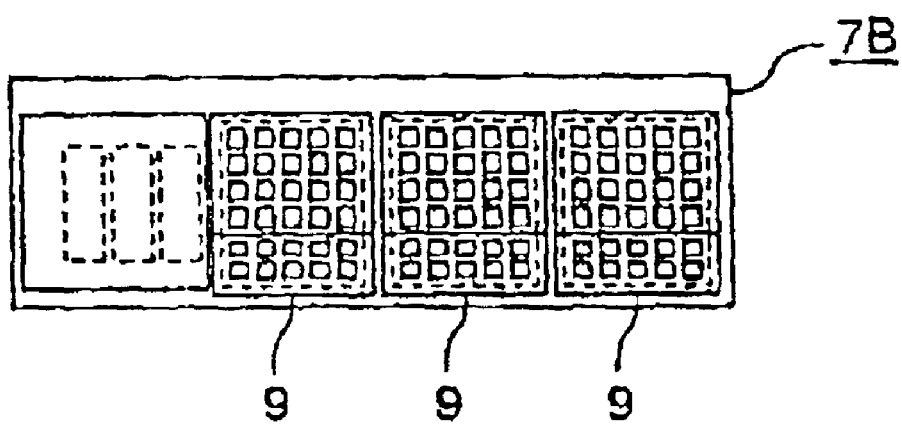
Figure 11A:
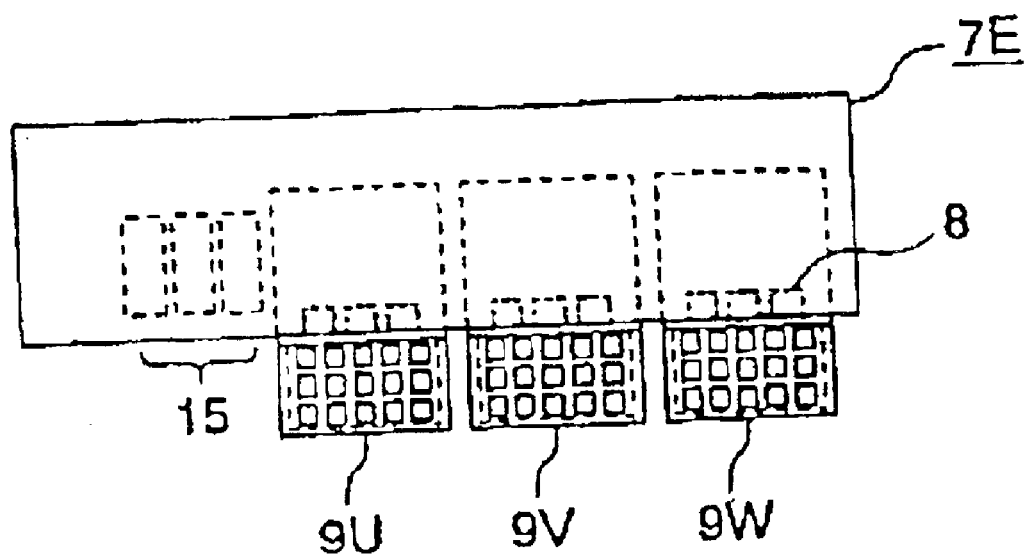
FIG. 11 is a plan view seen from the direction in which a second embodiment of a power conversion device according to the present invention is mounted on the bottom face of a vehicle and a bottom face view thereof.
Figure 11B:
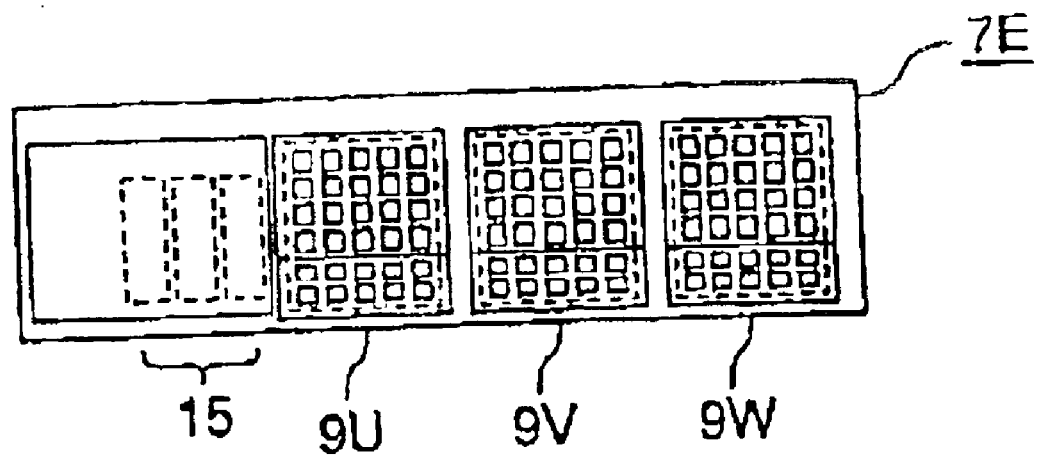

FIG. 11 illustrates the construction of a second embodiment of a power conversion device according to the present invention. Therein, FIG. 11A is a plan view seen from the direction of mounting on the bottom face of the vehicle and FIG. 11B is a bottom face view thereof. In the power conversion device 7E illustrated herein, the semiconductor elements 8 that respectively constitute the two sets of VVVF inverter circuits and the single set of CVCF inverters circuits shown in the circuit diagram of FIG. 4 are incorporated with and allocated to each phase. Specifically, of the three coolers 9U, 9V, 9W, two sets of semiconductor elements a of the U phase of the VVVF inverter circuits and one set of semiconductor elements 8 of the U phase of the CVCF inverter circuits are incorporated in cooling device 9U; two sets of semiconductor elements 8 of the V phase of the VVVF inverter circuits and one set of semiconductor elements 8 of the V phase of the CVCF inverter circuits are incorporated in cooling device 9V; and two sets of semiconductor elements 8 of the W phase of the VVVF inverter circuits and one set of semiconductor elements 8 of the W phase of the CVCF inverter circuits are incorporated in cooling device 9W. Three control sections 15 are also incorporated in this power conversion device 7E, the construction being such that the two sets of VVVF inverter circuits and one set of CVCF inverter circuits are respectively individually controlled.

Thus, when the two sets of VVVF inverter circuits and the single set of CVCF inverter circuits are all in normal condition, practically identical heat loss loads are imposed on the respective coolers 9U, 9V, 9W and the heat loss generated from all of the semiconductor elements 8 is discharged to the atmosphere from coolers 9U, 9V, 9W, semiconductor elements 8 thus being cooled to the permissible temperature or below.

In contrast, when malfunction of a CVCF inverter circuit occurs, one set of the VVVF inverter circuits is changed over to CVCF inverter circuits. A larger current than normal then flows in the remaining single set of VVVF inverter circuits that are continuing in operation, so it is necessary to prevent a drop in system performance. Consequently, a larger current than normal then flows in the remaining single set of VVVF inverter circuits that are continuing in operation, so it is necessary to prevent a drop in system performance. The amounts of heat loss generated from each single semiconductor element 8 therefore all become larger than in the case of a normal operation. However, the heat loss load is practically evenly distributed over all of the three coolers 9U, 9V and 9W and coolers 9U, 9V and 9W have the capability to disperse the heat lose produced by the original two sets of VVVF inverter circuits and the heat loss produced by the semiconductor elements 8 of the single set of CVCF inverter circuits, so, even though the heat loss of the single set that is continuing in operation is increased more than normal, satisfactory cooling is performed.

Thus, with the second embodiment, even if one set of CVCF inverter circuits malfunctions, all of the coolers perform the action of discharging the heat loss of the semiconductor elements, so an efficient cooling system can be achieved in which there is no waste in the cooling system. As a result, the coolers as a whole can be miniaturized and miniaturization and weight reduction of the entire power conversion device becomes possible.

Figure 7:
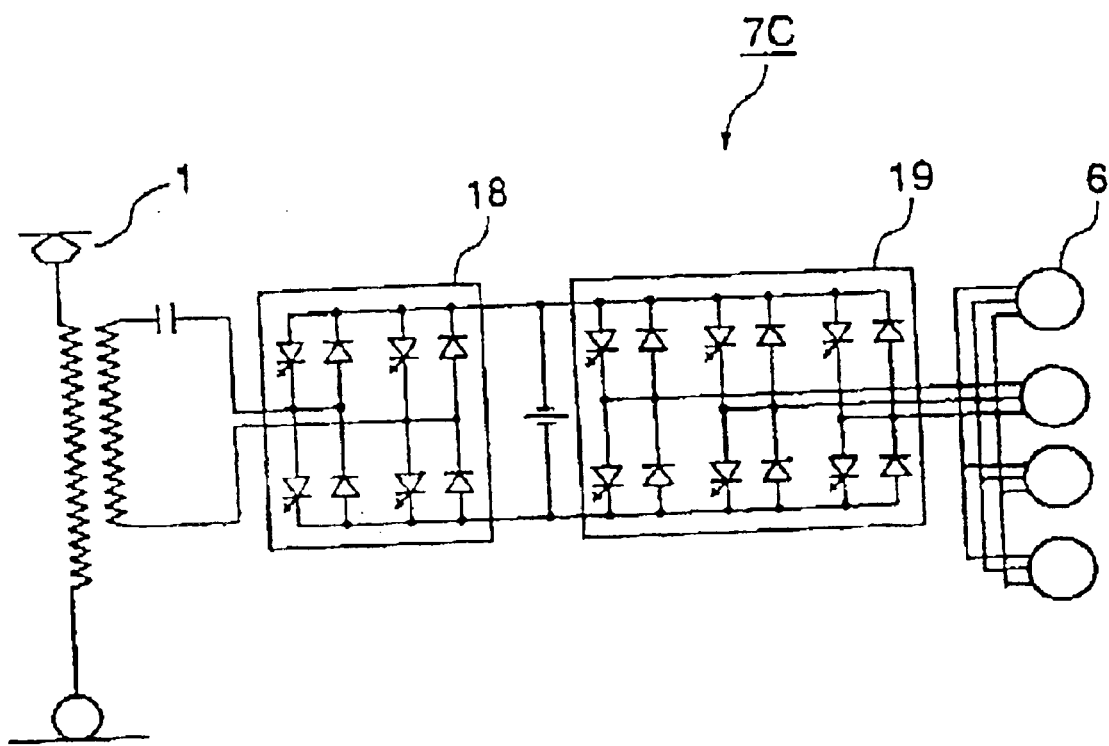
FIG. 7 is a circuit diagram of a power conversion device for vehicle drive incorporating a plurality of sets of conversion circuits and constituting yet a further prior art power conversion device.
Figure 8:
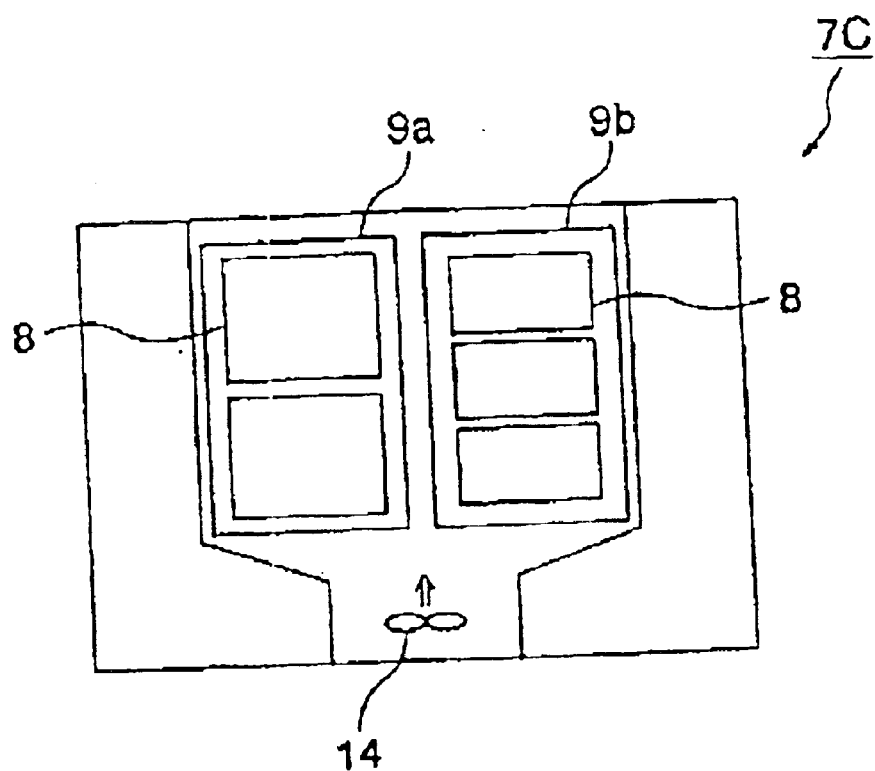
FIG. 8 is a plan view seen from the side where the power conversion device shown in FIG. 7 is mounted at the bottom of the vehicle and a side view seen from the direction of forward movement of the vehicle.
Figure 8:
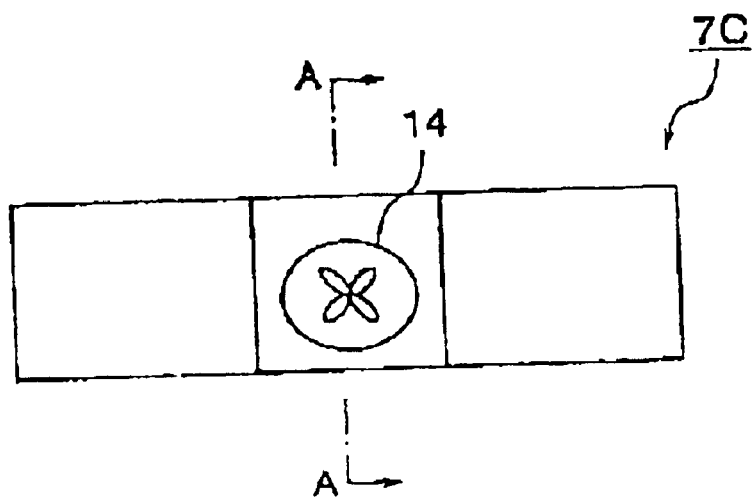
Figure 9:
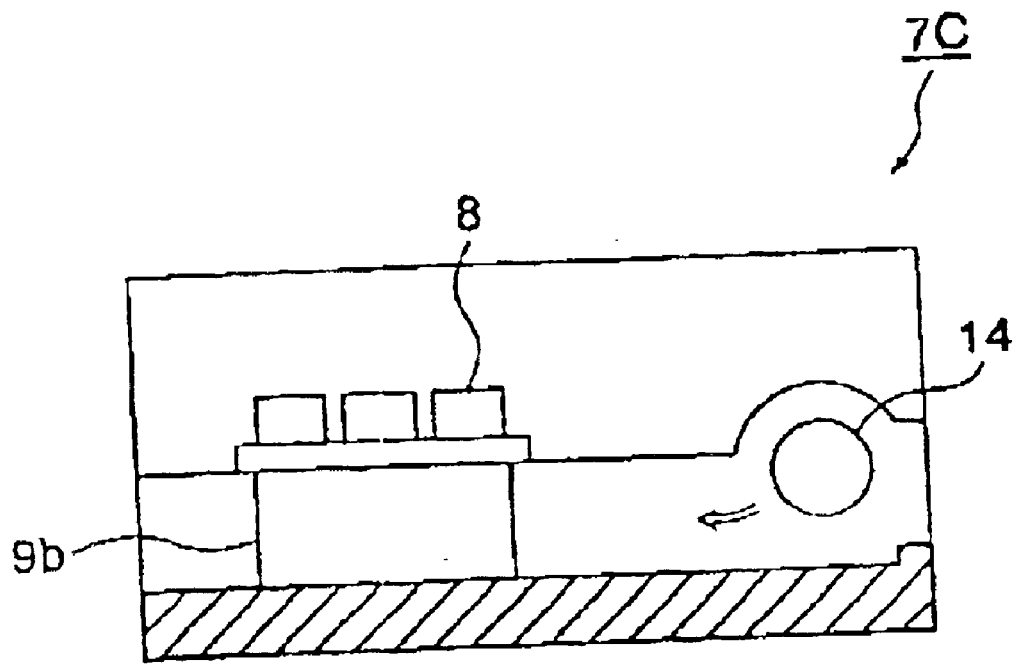
FIG. 9 is a vertical cross-sectional view seen along the arrows A—A of the power conversion device shown in FIG. 7.

FIG. 12 illustrates the construction of a third embodiment of a power conversion device according to the present invention. Therein, FIG. 12A is a plan view seen from the direction of mounting on the bottom face of the vehicle and FIG. 12B is a side view seen from the direction of forward movement of the vehicle. Power conversion device 7F illustrated herein is applied to the prior art device illustrated in the circuit diagram of FIG. 7; in this Figure, elements which are the same as in the case of FIG. 8 are given the same reference symbols and further description thereof is omitted. However, power conversion device 7F comprises a cooling unit 9c mounted on an air duct of an electrically driven fan 14. The semiconductor elements 8 that constitute the inverter circuits on this cooling unit 9c are incorporated in each of the U, V and W phases and are mounted, divided into three portions, in the width direction of the air duct; the semiconductor elements 8 that constitute the converter circuit are mounted, divided into two portions, in the width direction of the air duct, to the rear of the semiconductor elements 8 constituting the inverter circuit, as seen from the electrically driven fan 14, being divided between the positive side and negative side.

The operation of this embodiment is described below. At low speed i.e. when accelerating/decelerating, heat loss is chiefly generated from the semiconductor elements 8 of the inverter circuits and little heat loss is generated from the converter circuit. During high-speed operation, heat loss is chiefly generated from the semiconductor elements 8 of the converter circuit and little heat loss is generated from the semiconductor elements of the inverter circuits. Thus, the heat loss generated from the converter circuit and the heat loss generated from the inverter circuits do not increase and decrease with same timing but, rather the heat loss increases/decreases with different timings. In the cooling unit, the converter circuit and inverter circuits are respectively arranged apportioned in evenly distributed fashion in the width direction thereof and are arranged at the front and rear of the air duct, so practically uniform disposal of heat loss can be achieved over the entire speed range.

Thus, by arranging the converter circuit and inverter circuits that generate different amounts of heat loss depending on the speed region in the direction in front of and to the rear of the air duct, practically uniform heat lose loading of the cooling unit is achieved in all speed regions, so the coolers as a whole exhibit efficient cooling performance and an efficient cooling system call be achieved in which there is no waste in the cooling system.

Thus, with the third embodiment also, miniaturization of the coolers as a whole is possible and reduction in size and weight of the entire power conversion device can be achieved.

Figure 13A:
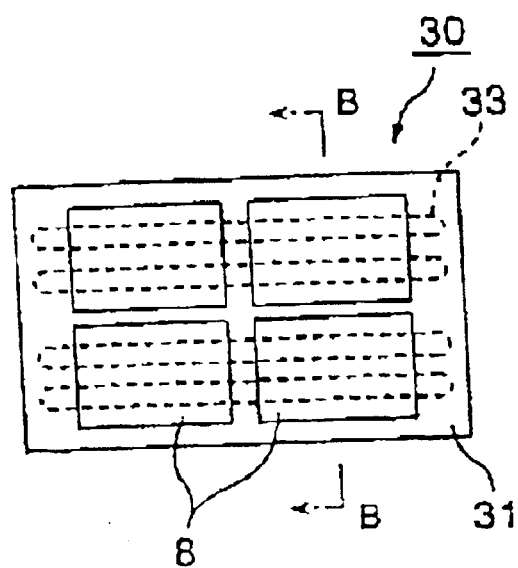
FIG. 13 is a plan view and a cross-sectional view seen along the arrows B—B illustrating the mounted condition of a cooling unit and semiconductor elements constituting a fourth embodiment of a power conversion device according to the present invention.
Figure 13B:
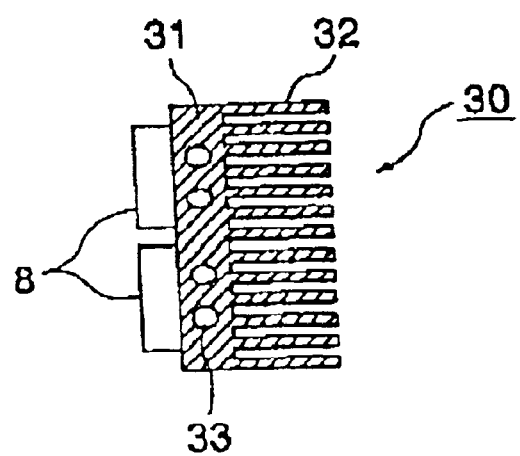

FIG. 13 shows a fourth embodiment of a power conversion device according to the present invention, being an example in which semiconductor elements 8 of four sets of inverter circuits 4 shown in FIG. 1 are mounted on a common cooling unit, FIG. 13A being a plan view showing the detailed construction and FIG. 13B being a cross-sectional view thereof. In these Figures, cooling unit 30 comprises a heat sink section 31 whose front face is flat and a heat discharging section 32 comprising a large number of heat discharging fins formed on its rear face. The semiconductor elements 8 that constitute the four sets of inverter circuits at the front face of heat sink section 31 are mounted in two rows and two columns for each set. Also, four beat pipes 33 are embedded in heat sink section 31 in parallel fashion with a suitable spacing in order to achieve thermal uniformity of this heat sink section 31.

Thus, while the heat pipes 33 embedded in heat sink section 31 of cooling unit 30 have the effect of making the entire heat sink section 31 thermally uniform, as described in the first and second embodiments, since with isolation due to malfunction heat loss is also transported to the mounting sections of the semiconductor elements to which power is no longer being supplied, cooling is performed with the heat loss of the semiconductor elements 8 that continue to operate being transported to the entire heat sink section 31.

Thus, thanks to the heat pipes 33 embedded in heat sink section 31 of cooling unit 30, the temperature of heat sink section 31 is made uniform not only during normal operation but also during operation when malfunction occurs; thus, the heat loss of the semiconductor elements 8 of the plurality of sets of inverter circuits is dispersed by the entire cooling unit 30 and an efficient cooling system can be realized with no waste in the cooling system. In this way, miniaturization of the coolers as a whole becomes possible and reduction in size and weight of the entire power conversion device can be achieved.

Figure 14A:
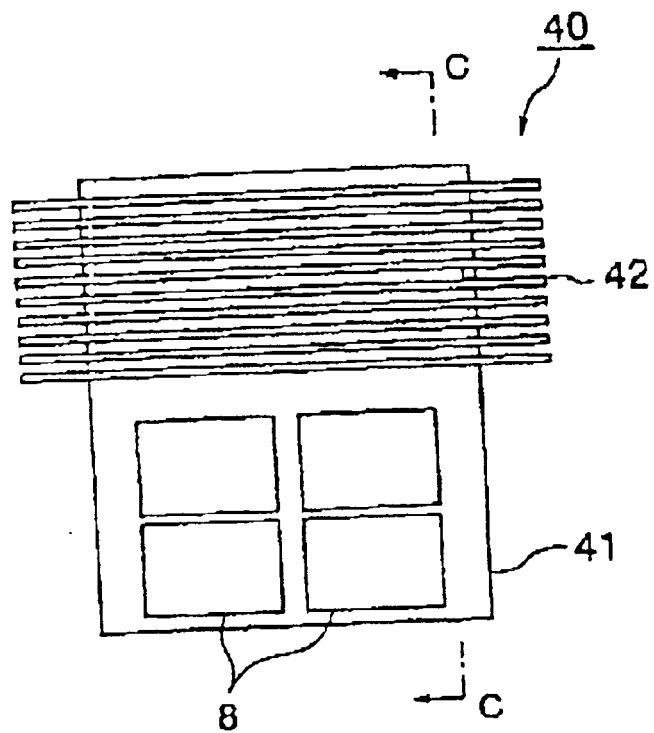
FIG. 14 is a plan view and a cross-sectional view seen along the arrows C—C illustrating the mounted condition of a cooling unit and semiconductor elements constituting a fifth embodiment of a power conversion device according to the present invention.
Figure 14B:
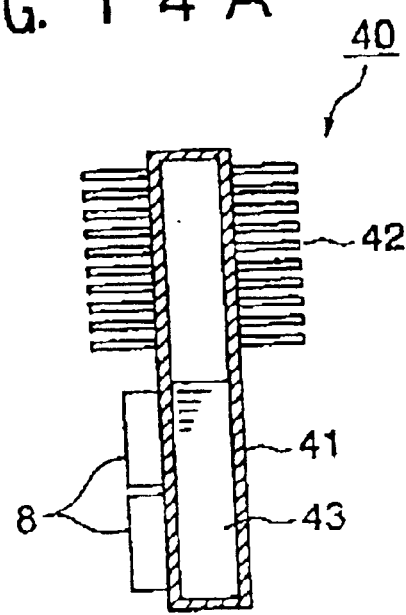

FIG. 14 illustrates a fifth embodiment of a power conversion device according to the present invention and is an example in which the semiconductor elements 8 of the four sets of inverter circuits 4 shown in FIG. 1 are mounted on a common cooling unit. FIG. 14A is a plan view showing the detailed construction and FIG. 14B is a cross-sectional view seen in the direction of arrows C—C. In these Figures, cooling unit 40 comprises a heat sink section 41 which is overall of flat box shape and a heat discharging section 42 that practically bisects this heat sink section 41 and wherein a large number of cooling fins are continuously formed at the periphery of one half thereof, the semiconductor elements 8 constituting the four sets of inverter circuits at the front face of the other halt being mounted in two rows and two columns for each set. The interior of heat sink section 41 has coolant 43 consisting of Fluorinert or water sealed therein.

This cooling unit 40 is of the boiling cooling type; thus the temperature of the mounting face of the semiconductor elements 8 can be efficiently equalized by coolant 43. In this way, miniaturization of the coolers as a whole becomes possible and reduction in size and weight of the entice power conversion device can be achieved.

Figure 15A:
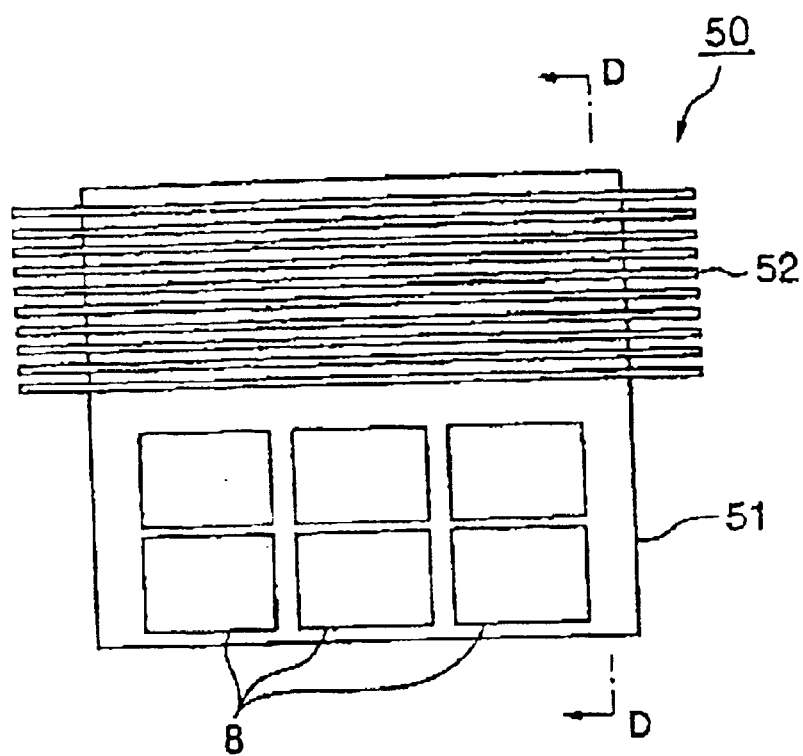
FIG. 15 is a plan view and a cross-sectional view seen along the arrows D—D illustrating the mounted condition of a cooling unit and semiconductor elements constituting a sixth embodiment of a power conversion device according to the present invention.
Figure 15B:
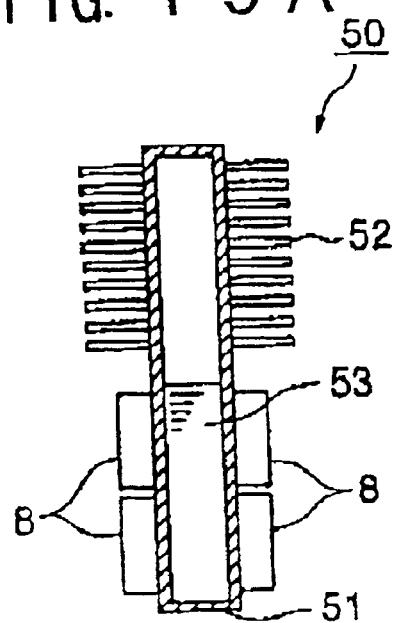

FIG. 15 illustrates a sixth embodiment of a power conversion device according to the present invention and is a constructional example of a cooling unit in which the semiconductor elements 8 constituting the four sets of inverter circuits 4 shown in FIG. 1 are mounted in common. FIG. 15A is a plan view showing the detailed construction and FIG. 15B is a cross-sectional view seen in the direction of arrows D—D. In these Figures, cooling unit 50 comprises a heat sink section 51 which is overall of flat box shape and a heat discharging section 52 that practically bisects this heat sink section 51 and wherein a large number of cooling fins are continuously formed at the periphery of one half thereof, six semiconductor elements 8 (corresponding to those constituting the two sets of inverters shown in FIG. 1) at the front face of the other half being mounted in two rows and three columns and six semiconductor elements 8 (corresponding to those constituting the two sets of inverters shown in FIG. 1) being mounted also on the rear face thereof in the same way as at the front face. The interior of heat sink section 51 has coolant 53 sealed therein.

This cooling unit 50 is of the boiling cooling type; thus the temperature of the mounting face of the semiconductor elements 8 can be efficiently equalized by coolant 53. Since in this case the semiconductor elements 8 are arranged in dispersed fashion on both faces, namely, the front face and rear face, of heat sink section 51, the benefits are obtained that the cooling efficiency is raised compared with that of the cooling unit 40 shown in FIG. 14 and, in addition, the arrangement of the conductors that electrically connect the semiconductor elements 8 can be simplified.

Figure 16A:
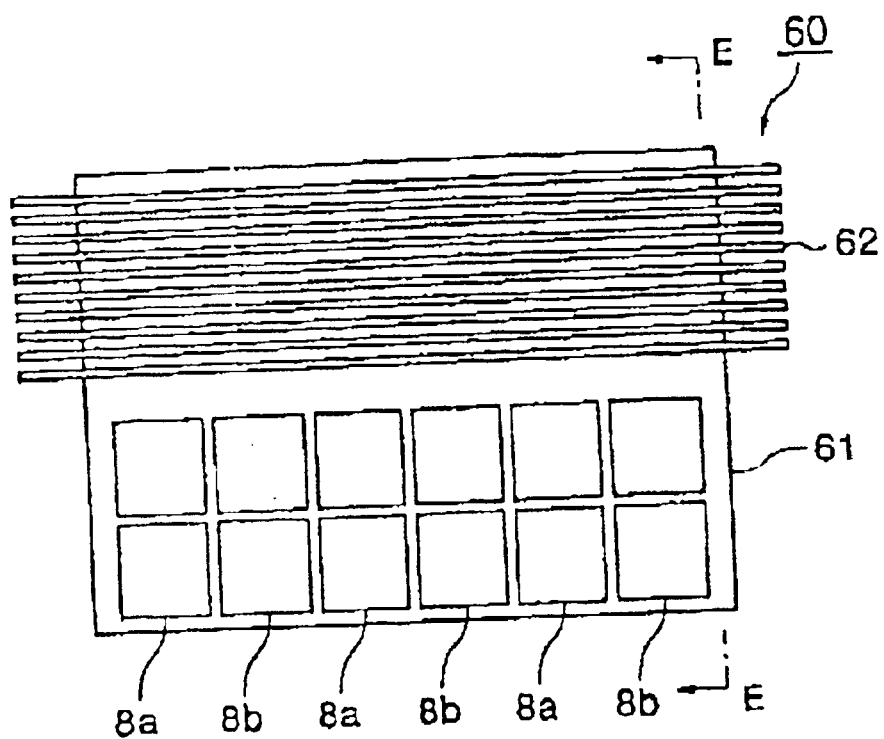
FIG. 16 is a plan view and a cross-sectional view seen along the arrows E—E illustrating the mounted condition of a cooling unit and semiconductor elements constituting a seventh embodiment of a power conversion device according to the present invention.
Figure 16B:
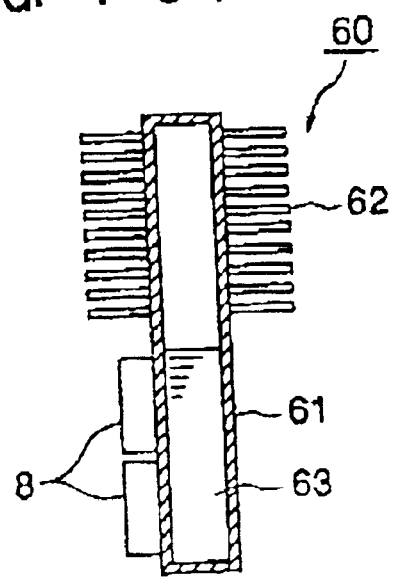

FIG. 16 illustrates a seventh embodiment of a power conversion device according to the present invention and is an example in which the semiconductor elements 8 of the four sets of inverter circuits 4 shown in FIG. 1 are mounted on a common cooling unit. FIG. 16A is a plan view showing the detailed construction and FIG. 16B is a cross-sectional view seen in the direction of arrows E—E. In these Figures, cooling unit 60 comprises a heat sink section 61 which is overall of flat box shape and a heat discharging section 62 that practically bisects this heat sink section 61 and wherein a large number of cooling fins are continuously formed at the periphery of one half thereof, semiconductor elements 8a and 8b of each phase being mounted at the front face of the remaining half, in two rows and six columns in the lateral width direction of the heat sink section 61 i.e. in each phase. The interior of heat sink section 61 has coolant 63 sealed therein.

It should be noted that, in this embodiment, of the four sets of inverter circuits shown in FIG. 1, corresponding to the employment of semiconductor elements of different type or rating in the two sets of inverter circuits and the remaining inverter circuits, the semiconductor elements 8a of the two sets of inverter circuits are arranged, with a separation, in the order: elements for the U phase, elements for the V phase, elements for the W phase, while the semiconductor elements 8b of the other two sets of inverter circuits are arranged adjacent to respective semiconductor elements 8a in the other: elements for the U phase, elements for the V phase, elements for the W phase.

In the case of this cooling unit 60 also, a more efficient cooling system can be realized than in the case of the coolers shown in FIG. 14 or FIG. 15 since the temperature of the heat sink section 61 is equalized so that it does not become partially biased in the event of malfunction.

Figure 17:
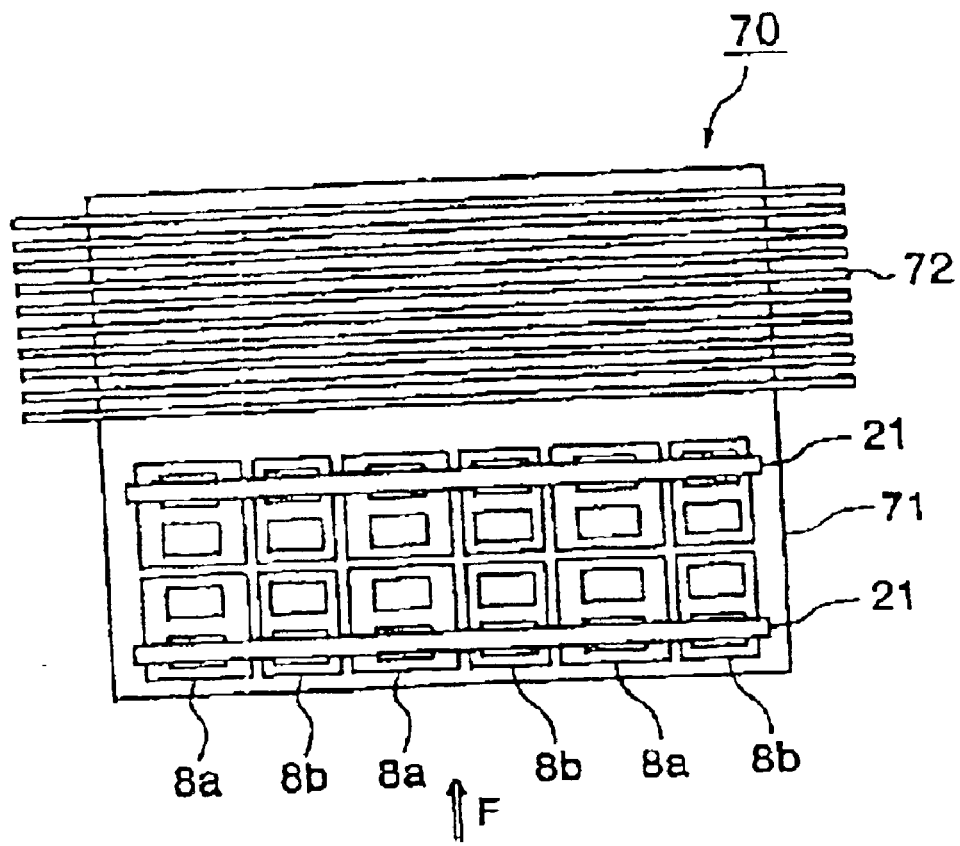
FIG. 17 is a plan view and a cross-sectional view seen along the arrow F illustrating the mounted condition of a cooling unit and semiconductor elements constituting an eighth embodiment of a power conversion device according to the present invention.
Figure 17:
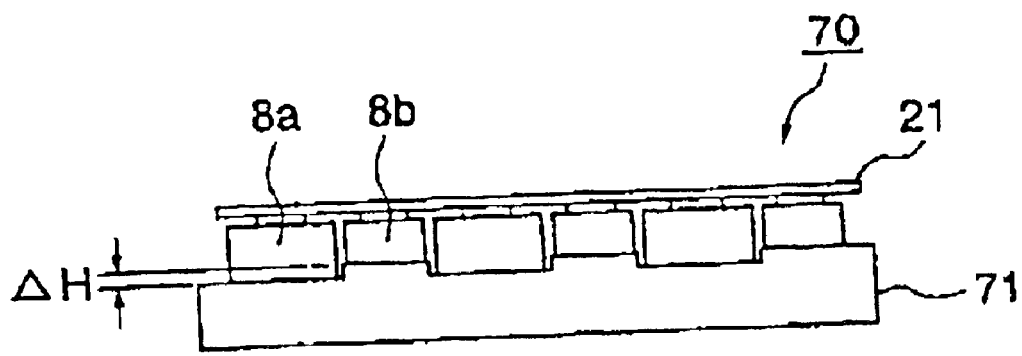

FIG. 17 illustrates an eighth embodiment of a power conversion device according to the present invention and is an example in which the semiconductor elements 8 of the sour sets of inverter circuits 4 shown in FIG. 1 are mounted on a common cooling unit. FIG. 17A is a plan view showing the detailed construction and FIG. 17B is a side view seen in the direction of arrow F. In these Figures, cooling unit 70 comprises a heat sink section 71 which is overall of flat box shape and a heat discharging section 72 that practically bisects this heat sink section 71 and wherein a large number of cooling fins are continuously formed at the periphery of one half thereof, semiconductor elements 8a and 8b of each phase as described above being arranged at the front face of the remaining half, in two rows and six columns in the lateral width direction of the heat sink section 61. The interior of heat sink section 61 has coolant 63 sealed therein.

In the illustrated cooling unit 70, when the electrical connection terminals of the semiconductor elements differ in height, irregularities are formed in the surface of each receiving section 71 such that the mounting faces of semiconductor elements 8a are lower than the mounting faces of semiconductor elements 8b by the amount of their difference of height ΔH, so as thereby to align their height positions. In this way, the heights of the electrical connection terminals of semiconductor elements 8a, 8b are aligned, so that they can be directly connected by means of a connecting conductor 21 in the form of a straight wire: this results in the advantages that electrical connection between the semiconductor elements is facilitated and, furthermore, construction is simplified.

Figure 18A:
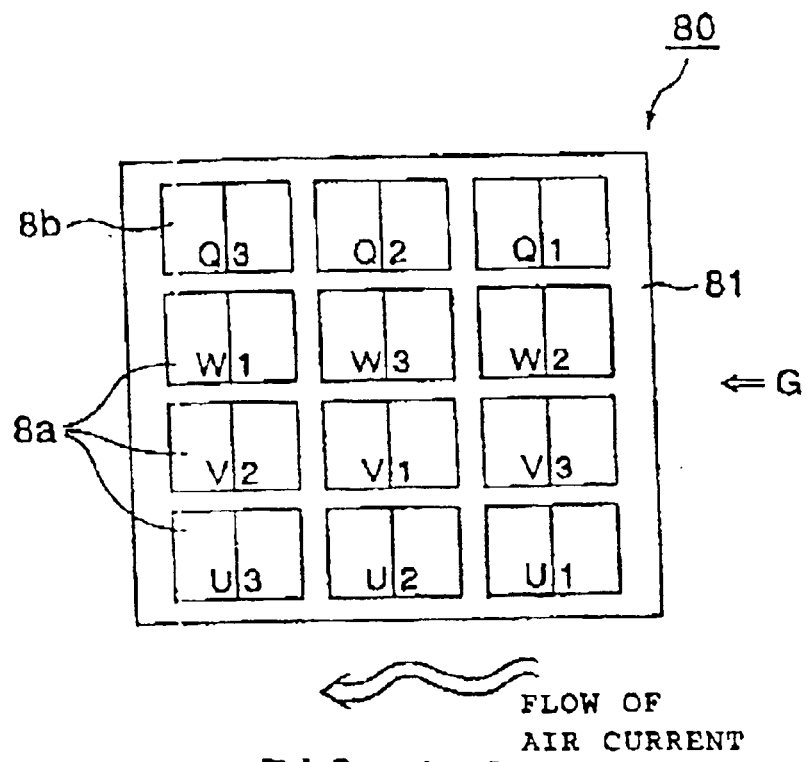
FIG. 18 is a plan view and a cross-sectional view seen along the arrow G illustrating the mounted condition of a cooling unit and semiconductor elements constituting a ninth embodiment of a power conversion device according to the present invention.
Figure 18B:
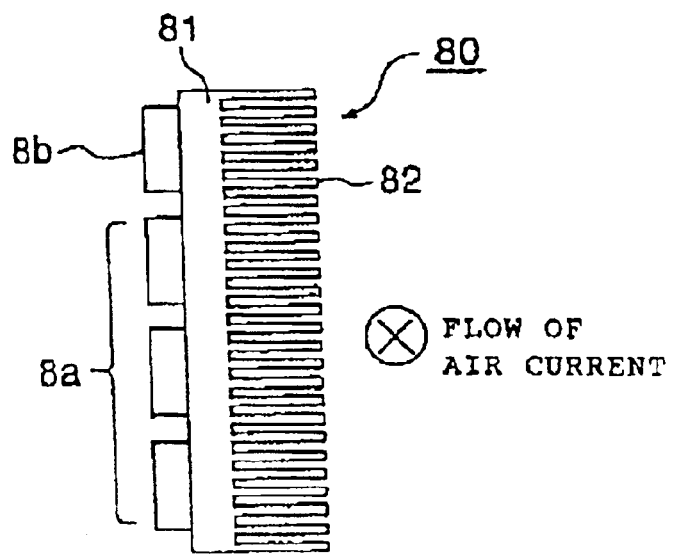

FIG. 18 illustrates a ninth embodiment of a power conversion device according to the present invention and shows in particular a modified example of the cooling unit constituting a third embodiment illustrated in FIG. 12. In this Figure, FIG. 18A is a plan view illustrating the detailed construction of the cooling unit and the condition of mounting of the semiconductor elements and FIG. 18b is a side view seen in the direction of arrow G. Cooling unit 80 comprises a flat plate-shaped heat sink section 81. This heat sink section 81 may be of a construction having heat pipes embedded in the interior thereof, or may be formed in box shape, with coolant sealed in its interior. Semiconductor elements 8a constituting inverters 81 and semiconductor elements 8b constituting a converter are fitted on the front face of this heat sink section; a heat discharging section 82 in which a large number of cooling fins are arranged side by side in the direction of flow of the air current is formed on the rear face of heat sink section 81.

The semiconductor elements 8a mounted on the front face of the heat sink section 81 of this cooling unit and 80 include a group of three semiconductor elements U1, U2, U3 for the U phases constituting the three sets of inverter circuits, a group of three semiconductor elements V1, V2, V3 for the V phases constituting the three sets of inverter circuits, and a group of three semiconductor elements W1, W2, W3 for the W phases constituting the three sets of inverter circuits. Semiconductor elements 8b include a group of three semiconductor elements Q1, Q2, Q3 constituting the three sets of converter circuits.

Regarding these semiconductor elements, seen from the direction in which the air current passes through heat discharging section 82, semiconductor elements U1, U2, U3 of the U phase of the inverter circuits, semiconductor elements V1, V2, V3 of the V phase and semiconductor elements W1, W2, W3 of the W phase are successively arranged in sequence and beside them semiconductor elements Q1, Q2, Q3 of the converter circuits are arranged in a row. The characteristic feature of this embodiment is that, whereas the semiconductor elements are of the U phase are arranged in the order U1, U2, U3 in the direction of passage of the air current, the semiconductor elements of the V phase are arranged in the order V3, V1, and V2 and the semiconductor elements of the W phase are arranged in the order W2, W3, W1.

As is well known, due to the heat loss of semiconductor elements whilst the cooling air current passes through between cooling fins 82 of cooling unit 80, the temperature of the cooling air current gradually rises. Consequently, the cooling efficiency of the semiconductor elements arranged upstream is high whereas the cooling efficiency of the semiconductor elements arranged downstream is low. Accordingly, as described above, by altering the position of the semiconductor elements of each set of inverters in a regular fashion in the direction of passage of the cooling air current, the rise in temperature of the semiconductor elements can be smoothed out in each set of inverters and an efficient cooling system thereby achieved.

Also, although, when, due to malfunction, operation is performed with one set of inverters isolated, the heat loss from the semiconductor elements of these inverter circuits disappears and the heat loss from the semiconductor elements of the remaining inverters increases, since a margin exists in respect of the cooling capacity a system of excellent redundancy on malfunction can be constituted.

Figure 19:
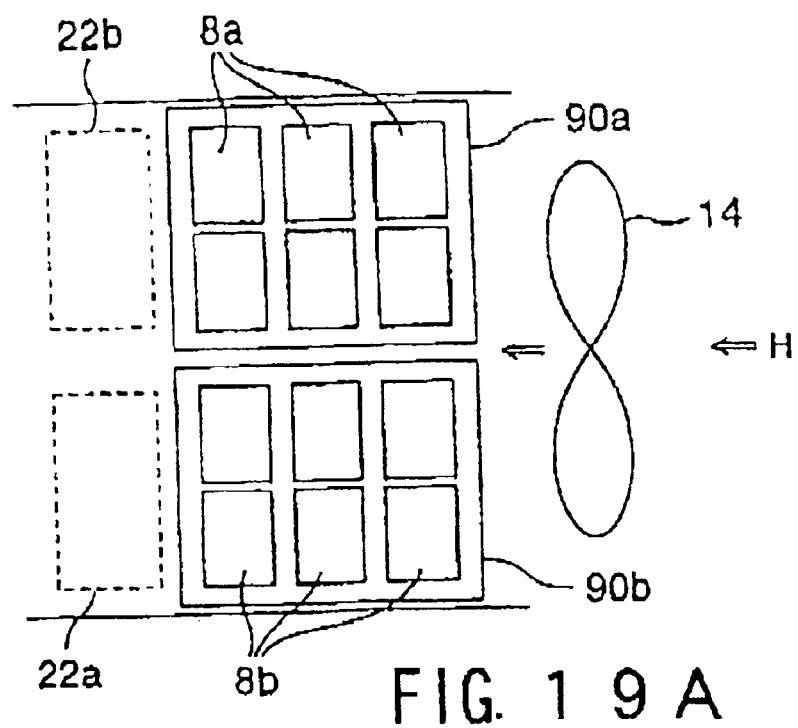
FIG. 19 is a plan view and a cross-sectional view seen along the arrow H illustrating the mounted condition of a cooling unit and semiconductor elements constituting a tenth embodiment of a power conversion device according to the present invention.
Figure 19:
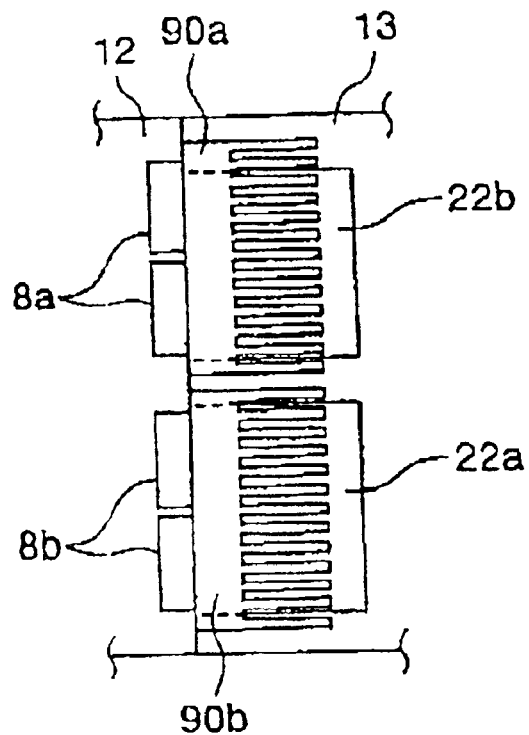

FIG. 19 illustrates a tenth embodiment of a power conversion device according to the present invention, which is of a construction in which an electrically driven fan is arranged in an open chamber portion adjacent to a sealed chamber portion and two cooling units and two peripheral circuits associated therewith are arranged next to each other in the direction of flow of the air current, FIG. 19A showing a plan view thereof and FIG. 19B showing a side view seen in the direction of arrow H. In these Figures, the two cooling units 90a and 90b have the same shape as the cooling unit shown in FIG. 13; six semiconductor elements 8a are mounted on the front face of the heat sink section of cooling unit 90a while six semiconductor elements 8b are mounted on the front face of the heat sink section of cooling unit 90b. These cooling units 90a and 90b are mounted such that the semiconductor elements 8a and 8b are accommodated on the side of the sealed chamber portion 12, while the heat discharging section comprising the cooling fins is positioned on the side of the open chamber portion 13. In this case, cooling units 90a and 90b are arranged next to each other in the direction perpendicular to the direction in which the air current is fed in by the electrically driven fan 14. Furthermore, the peripheral circuit 22a associated with semiconductor elements 8a mounted in cooling unit 90a is mounted in the open chamber portion on the downstream side of cooling unit 90b seen in the direction of air current flow; contrariwise, the peripheral circuit 22b associated with semiconductor elements 8b mounted in cooling unit 90b is mounted in the open chamber portion on the downstream side of cooling unit 90a seen in the direction of air current flow. That is, the mutually associated cooling units and peripheral circuitry are mounted in mutually interchanged positions. That is, the peripheral circuit 22b is mounted on the downstream side in the direction of the air current of cooling unit 90a and contrariwise the peripheral circuit 22b is mounted on the downstream side in the direction of the air current of cooling unit 90b.

In this case, the circuits constituted by semiconductor elements 8a and 8b are positioned as main circuits with respect to the peripheral circuits described above.

In this way, by arranging the peripheral circuits 22a and 22b mutually downstream of the other set, the conversion circuits of the plurality of sets are made common with respect to the flow of the cooling air current, so the rise in temperature of the cooling air current is smoothed out. Also, in the same way as in the case of the ninth embodiment illustrated in FIG. 18, when one set is isolated due to malfunction, even though, while the heat loss of the cooling units 90b, 90a where the semiconductor elements 8a, 8b on the upstream side constituting peripheral circuits 22a, 22b are mounted becomes less whereas the amount of heat generated by operation of the remaining sets increases, thanks to the margin that is provided in respect of the cooling capability, a system of excellent redundancy in the event of malfunction can be constituted.

As will be clear from the above description, according to the present invention; a power conversion device can be provided wherein, by smoothing out the contributions of the heat loss applied to a plurality of coolers, a cooling construction of the minimum necessary size can be achieved and miniaturization and weight reduction realized.

Obviously, numerous additional modifications and variations of the present invention are possible in light of the above teachings. It is therefore to be understood that within the scope of the appended claims, the present invent ion may be practiced otherwise than as specially described herein.

What is claimed is:

1. A power conversion device, comprising:
a plurality of sets of power conversion circuits comprising a plurality of semiconductor elements; and
a cooling unit comprising a heat sink section and a heat discharging section to cool said power conversion circuits,
wherein said plurality of semiconductor elements are divided into each phase or into a positive side and a negative side, and said sets of divided semiconductor elements are mounted on said cooling unit such that a set of divided semiconductor elements for the same phase or same side is arranged in row fashion in a direction of flow of a cooling air current.

2. A power conversion device, comprising:
a plurality of sets of power conversion circuits comprising a plurality of semiconductor elements; and
a cooling unit comprising a heat sink section and a heat discharging section to cool said power conversion circuits,
wherein said heat sink section of said cooling unit is of box shape with coolant sealed inside.

3. A power conversion device, comprising:
a plurality of sets of power conversion circuits comprising a plurality of semiconductor elements; and
a cooling unit comprising a heat sink section and a heat discharging section to cool said power conversion circuits,
wherein said heat sink section of said cooling unit is constructed so that semiconductor elements can be mounted on a front face and a rear face, a set of semiconductor elements that constitutes one set of said power conversion circuits being mounted on one face, while a set of semiconductor elements that constitutes another set of power conversion circuits is mounted on said other face.

4. A power conversion device, comprising:
a plurality of sets of power conversion circuits comprising a plurality of semiconductor elements; and
a cooling unit comprising a heat sink section and a heat discharging section to cool said power conversion circuits,
wherein said plurality of semiconductor elements are divide into each phase, sets of semiconductor elements of different power conversion circuits in a first set of power conversion circuits are mounted and arranged, alternately with sets of semiconductor elements of different power conversion circuits in second set of power conversion circuits, for each phase on one face of said cooling unit.

5. The power conversion device according to claim 4, wherein when said semiconductor elements are of different height for each power conversion circuit, a step is provided in said semiconductor mounting face of said cooling unit so that heights of electrical connection terminals of said semiconductor elements are equal.

6. The power conversion device of claim 1, wherein said semiconductor elements are mounted on said cooling unit such that semiconductor elements for different phases or different sides of at least one of said power conversion circuits are arranged in row fashion substantially perpendicular to said direction of flow of said cooling air current.

7. The power conversion device according to any claims 1 and 2–4, wherein said plurality of semiconductor elements convert AC to DC o DC to AC by switching actions of said semiconductor elements.

8. The power conversion device according to any of claims 1 and 2–4, wherein said plurality of sets of power conversion circuits comprises a plurality of sets of inverter circuits configured to connect loads of respectively different outputs by switching actions of said plurality of semiconductor elements.

9. The power conversion device according to any of claims 1 and 2–4, wherein said plurality of sets of power conversion circuits comprises:

a plurality of sets of variable voltage, variable frequency inverter circuits that invert DC to AC of variable voltage and variable frequency by switching actions of said plurality of semiconductor elements, and a constant voltage, constant frequency inverter circuit that inverts DC to AC of constant voltage and constant frequency.

10. The power conversion device according to any of claims 1 and 2–4, wherein said plurality of sets of power conversion circuits comprises:

a converter circuit that converts AC to DC by switching actions of said plurality of semiconductor elements; and an inverter circuit that inverts said DC converted by said converter circuit to AC.

11. A power conversion device, comprising:

a plurality of sets of power conversion circuits that convert AC to DC or DC to AC by switching actions of a plurality of semiconductor elements;

wherein if one set of said power conversion circuits malfunctions, said malfunctioning power conversion circuits are isolated and operation continued with remaining set of power conversion circuits, and a cooling unit having a heat sink section and heat discharging section and constructed such that a current of cooling air flows to said heat discharging section;

wherein said semiconductor elements that constitute said plurality of power conversion circuits are apportioned to each phase, a set of said semiconductor elements for the same phase are arranged in row fashion in a direction of flow of a cooling air current, and semiconductor elements of different said power conversion circuits being mounted in common on said heat sink section and arranged in sequence in each phase in a direction of flow of said cooling air current.

12. A power conversion device, comprising:

a plurality of sets of power conversion circuits that convert AC to DC or DC to AC by switching actions of a plurality of semiconductor elements;

wherein if one set of said power conversion circuits malfunctions, said malfunctioning power conversion circuits are isolated and operation continued with remaining sets of power conversion circuits, and a cooling unit having a heat sink section and heat discharging section and constructed such that a current of cooling air flows to said heat discharging section;

wherein said power conversion device is divided into a main circuit comprising said set of semiconductor elements for each said power conversion circuit and a peripheral circuit that protects said semiconductor elements, said set of semiconductor elements of mutually different said power conversion circuits and said peripheral circuit being arranged in row fashion in a direction of flow of a cooling air current and said main circuit comprising said set of semiconductor elements being mounted on said heat sink section of said cooling unit and said peripheral circuit being arranged in a position through which a cooling air current flows.

* * * * *

UNITED STATES PATENT AND TRADEMARK OFFICE
CERTIFICATE OF CORRECTION

PATENT NO. : 6,870,737 B2
DATED : March 22, 2005
INVENTOR(S) : Hashimoto et al.

It is certified that error appears in the above-identified patent and that said Letters Patent is hereby corrected as shown below:

Column 14,
Line 61, change "divide" to -- divided --.
Line 65, change "in second" to -- in a second --.

Column 15,
Line 13, change "any claims" to -- any of claims --.

Signed and Sealed this

Thirty-first Day of May, 2005

JON W. DUDAS
*Director of the United States Patent and Trademark Office*